United States Patent
Li et al.

(10) Patent No.: US 12,054,656 B2
(45) Date of Patent: Aug. 6, 2024

(54) COMPOSITE LIGHT-EMITTING MATERIAL, PRODUCTION METHOD THEREOF, AND USE THEREOF

(71) Applicants: Zhijing Nanotech Co., LTD, Beijing (CN); Beijing Institute of Technology, Beijing (CN)

(72) Inventors: Fei Li, Beijing (CN); Haizheng Zhong, Beijing (CN); Jingjing Wang, Beijing (CN)

(73) Assignees: Zhijing Nanotech Co., LTD, Beijing (CN); Beijing Institute of Technology, Beijing (CN)

( * ) Notice: Subject to any disclaimer, the term of this patent is extended or adjusted under 35 U.S.C. 154(b) by 710 days.

(21) Appl. No.: 17/276,723

(22) PCT Filed: Aug. 2, 2019

(86) PCT No.: PCT/CN2019/098997
§ 371 (c)(1),
(2) Date: Mar. 16, 2021

(87) PCT Pub. No.: WO2020/244046
PCT Pub. Date: Dec. 10, 2020

(65) Prior Publication Data
US 2022/0002618 A1 Jan. 6, 2022

(30) Foreign Application Priority Data
Jun. 4, 2019 (CN) .............................. 201910480980

(51) Int. Cl.
*C09K 11/02* (2006.01)
*C09K 11/06* (2006.01)
(Continued)

(52) U.S. Cl.
CPC ............ *C09K 11/025* (2013.01); *C09K 11/06* (2013.01); *C09K 11/665* (2013.01); *H10K 85/30* (2023.02);
(Continued)

(58) Field of Classification Search
CPC .............................. C09K 11/66; B82Y 20/00
See application file for complete search history.

(56) References Cited

U.S. PATENT DOCUMENTS 10,193,088 B2 1/2019 Lee et al.
10,920,137 B2 2/2021 Lüchinger et al.
(Continued)

FOREIGN PATENT DOCUMENTS

JP 2018530633 A 10/2018
KR 20160055090 A1 5/2016

OTHER PUBLICATIONS

Japanese Office Action corresponding to JP 2021-526559; dated Oct. 4, 2022 (4 pages, including English translation).
(Continued)

*Primary Examiner* — Khanh T Nguyen
(74) *Attorney, Agent, or Firm* — Myers Bigel, P.A.

(57) ABSTRACT

The present application discloses a composite light-emitting material, a production method thereof, and use thereof, wherein the composite light-emitting material has a perovskite nanomaterial and a matrix; the perovskite nanomaterial comprises $\gamma$-$CsPbI_3$ and an addition element M; and the addition element M is selected from at least one of Li, Na, K, and Rb.

17 Claims, 7 Drawing Sheets

(51) Int. Cl.
  *C09K 11/66* (2006.01)
  *H10K 85/30* (2023.01)
  *G02F 1/13357* (2006.01)
  *H10K 50/115* (2023.01)

(52) U.S. Cl.
  CPC .... *C09K 2211/10* (2013.01); *C09K 2211/181* (2013.01); *C09K 2211/188* (2013.01); *G02F 1/133617* (2013.01); *H10K 50/115* (2023.02)

(56) References Cited

U.S. PATENT DOCUMENTS

| | | |
|---|---|---|
| 11,286,421 B2 | 3/2022 | Lüchinger et al. |
| 11,414,597 B2 | 8/2022 | Lüchinger et al. |
| 2017/0358757 A1 | 12/2017 | Lee et al. |
| 2018/0208840 A1 | 7/2018 | Lüchinger et al. |
| 2021/0130687 A1 | 5/2021 | Lüchinger et al. |
| 2022/0195295 A1 | 6/2022 | Lüchinger et al. |

OTHER PUBLICATIONS

Baek, et al., "Development of Mixed-Cation CsxRb1-xPbX3 Perovskite Quantum Dots and Their Full-Color Film with High Stability and Wide Color Gamut", Advanced Optical Materials, 6(15): 1800295, 2018, 1-6.
Kubicki, et al., "Phase Segregation in Potassium-Doped Lead Halide Perovskites from 39K Solid-State NMR at 21.1 T", Journal of the American Chemical Society, 140(23), 2018, 7232-7238.
Xiang, et al., "Natrium Doping Pushes the Efficiency of Carbon-Based CsPbI3 Perovskite Solar Cells to 10.7%", iScience, 15, 2019, 156-164.
"Abdi-Jalebi Mojtaba et al: ""Potassium-and Rubidium-Passivated Alloyed Perovskite Films: Optoelectronic Properties and Moisture Stability""", ACS Energy Letters, vol. 3, No. 11, Sep. 28, 2018 (Sep. 28, 2018), p. 2671-2678".
Extended European Search Report issued Jul. 24, 2023 from EPO for European application No. 19931951.8, 11 pages.
Guhrenz Chris et al: "Solid-State Anion Exchange Reactions for Color Tuning of CsPbX 3 Perovskite Nanocrystals", Chemistry of Materials, vol. 28, No. 24, Dec. 9, 2016 (Dec. 9, 2016) , pp. 9033-9040.
Huang Shouqiang et al: "Postsynthesis Potassium-Modification Method to Improve Stability of CsPbBr 3 Perovskite Nanocrystals", Advanced Optical Materials, vol. 6, No. 6, Feb. 16, 2018 (Feb. 16, 2018) , p. 1701106.
Office Action issued Oct. 13, 2023 from KIPO for Korean application No. 10-2021-7009304 with translation, 6 pages.
Yi Wei et al: "An overview on enhancing the stability of lead halide perovskite quantum dots and their applications in phosphor-converted LEDs", Chemical Society Reviews, vol. 48, No. 1, Nov. 22, 2018 (Nov. 22, 2018), pp. 310-350.
Chao Jia et al., CsPbX3/Cs4PbX6 Core/Shell Perovskite Nanocrystals, The Royal Society of Chemistry, ChemComm, May 23, 2018, pp. 6300-6303, vol. 00, No. 1-3.
Xian-Gang Wu et al., Highly Luminescent Red Emissive Perovskite Quantum Dots-Embedded Composite Films: Ligands Capping and Caesium Doping-Controlled Crystallization Process, The Royal Society of Chemistry, Nanoscale, Feb. 18, 2019, pp. 4942-4947, vol. 11.
Юнакова,, О.Н.et al., Спектры поглощения тонких пленок тройных соединений в системе RbI-PbI (The absorption spectra of thin films of ternary compounds in the RbI-PbI2 system), Low Temperature Physics, Dec. 31, 2012, pp. 1191-1196, vol. 38, No. 10.
PCT International Search Report and Written Opinion (and English translations); PCT/CN2019/098997; Mar. 6, 2020.
Office Action for KR 10-2021-7009304 mailed Apr. 24, 2023 with translation, 8 pages.

COMPOSITE LIGHT-EMITTING MATERIAL, PRODUCTION METHOD THEREOF, AND USE THEREOF

TECHNICAL FIELD

The present application relates to a composite light-emitting material, and belongs to the field of materials.

BACKGROUND ART

A perovskite material typically has a structural formula of $ABX_3$, wherein A may be $K^+$, $Na^+$, $Rb^+$, $Cs^+$, a micromolecular organic cation, or the like, B may be various elements such as $Pb^{2+}$, $Sn^{2+}$, $Ti^{4+}$, $Cr^{3+}$, $Bi^{3+}$, or the like, and X may be composed of an anion such as $O^{2-}$, $Cl^-$, $Br^-$, $I^-$, $S^{2-}$, or the like. A material having a perovskite structure has a number of unique physicochemical properties, for example, light absorption property, electro-catalytic property, and the like, and has been widely used in chemical and physical fields. Halide perovskites are a kind of compound having a perovskite structure in which X is an anion of a halogen (Cl, Br, I), wherein A may be either a micromolecular organic cation or an inorganic metal cation, and are referred to as an organic-inorganic hybridized halide perovskite and an all-inorganic halide perovskite, respectively. The crystal structure of the halide perovskite is that an octahedronal structure is composed of 1 B metal atom and 6×atoms and an A atom is embedded in the center of a cubic structure formed by 8 octahedrons, among which a pair of octahedrons share 1×atom. The halide perovskite material has unique photoelectric semiconductive characteristics such as a suitable band gap, a relatively high carrier mobility, a very strong defect tolerance, a relatively low rate of shallow spot defects, relatively low rates of grain boundary recombination and surface recombination, and a relatively large light absorption coefficient generated by s-p antibonding coupling. These unique optical and semiconductive characteristics allow halide perovskite materials to become desirable selection for photoelectric conversion materials in solar cells. In 1990s, the research team of Mitzi explored photoelectric properties of organic-inorganic hybridized perovskite materials for the first time, and found that it has a good electron mobility and has a potential application value in solar cells. In 2009, the research team of Kojima produced a dye-sensitized solar cell using $CH_3HN_3PbX_3$ (X=Cl, Br, I) as a photosensitive material, which had a photoelectric conversion efficiency of up to 3.8%. The research of perovskite materials in the field of photoelectrics was introduced to an expressway. At present, the efficiency of a perovskite photovoltaic device has been steadily increased to 22.1%, as verified by National Renewable Energy Laboratory (NREL).

The upsurge of the research in perovskite solar cells drives rapid development of $ABX_3$ lead halogen perovskite quantum dot (described as perovskite quantum dots hereinafter) light-emitting materials. Compared to Group II-VI quantum dots which are being industrialized, perovskite quantum dots have the characteristics of low cost, simple production process, low toxicity of materials, and the like. At the meanwhile, the light-emitting properties of perovskite quantum dots are comparable to or even better than those of Group II-VI quantum dots, wherein the emission spectrum covers the entire wavelengths of visible light (410-700 nm), the fluorescence quantum yield is high (>90%), and the emission peak is narrow (the full width at half maximum is 20-50 nm). However, the ionicity of the crystal structure of a perovskite material, the proton exchange reaction between ligands, and a relatively strong ion mobility and a relatively low crystal formation energy of halide ions result in a poor stability of perovskite quantum dots. Extraneous factors, which can reduce optical properties of perovskite quantum dots, mainly include $H_2O$, $O_2$, light, and heat. The ionicity of a crystal structure allows a perovskite quantum dot to be easily degraded by a polar solvent, particularly $H_2O$ in the environment, so as to lose optical properties. $O_2$, in cooperation with $H_2O$, accelerates decomposition of perovskite quantum dots, and reduces optical properties of perovskite quantum dots as a light quenching agent. Ultraviolet allows a perovskite quantum dot to generate excited radiation. The process of the reaction of $H_2O$ and $O_2$ with perovskite quantum dots are accelerated by the thermal effect generated in the process of non-radiative recombination of excitons. Thermal quenching of excitons occurs at the same time, and optical properties of perovskite quantum dots are reduced.

With respect to the problem that the stability of the perovskite quantum dot is poor, it is an effective method for achieving high-stability perovskite quantum dots to produce a polymer-coated perovskite quantum dot composite. The research team of Yuhua Wang mixed a preliminarily synthesized $CsPbX_3$ quantum dot with a polymer Ergo to produce a $CsPbX_3$/Ergo composite thin film. The stability of the $CsPbI_3$ quantum dot in air and water may be elongated from 5 h to 25 h or more by this thin film. The research team of A. Paul Alivisatos synthesized perovskite nanocrystals having different morphologies, which are embedded in poly (lauryl methacrylate) (PLMA), polystyrene-ethylene-butene-styrene (SEBS), and polystyrene (PS), respectively, so that the stability of perovskite quantum dots is greatly improved and the composite thin film of perovskite nanowires maintains its polarizing light-emitting property. The research team of Dwight S. Seferos embedded perovskite quantum dots in methyl methacrylate (MMA), and this perovskite quantum dot/MMA composite thin film may have a stability of 30 days or more. However, concerning a polymer composite thin film based on preliminarily synthesized perovskite quantum dots, there is usually a problem of low fluorescence quantum yield. The $CsPbX_3$/Ergo composite thin film has a fluorescence quantum yield of only 43%, and the perovskite quantum dot/MMA composite thin film even has a fluorescence quantum yield reduced from 100% for a perovskite quantum dot solution to 56% for a composite. This is because the synthesis of perovskite quantum dots requires a complicated purification step, for example, removing a large amount of organic solvent and long-chain ligand in the process of reaction, and this process will have an unfavorable effect on the light-emitting properties of the perovskite nanomaterial. Additionally, perovskite quantum dots purified by separation will also influence their dispersion in a coating matrix, and agglomeration will sharply reduce the fluorescence quantum yield of quantum dots and lower the light transmittance of the composite obtained, thereby influencing properties of devices. In order to improve the stability of the perovskite quantum dot while maintaining its excellent light-emitting properties, researchers have developed a method for in situ production of a perovskite quantum dot/polymer composite light-emitting thin film. The research team of Yajie Dong used a swelling-deswelling method for in situ production of perovskite quantum dot/polymer composite thin films of five different polymer matrices, wherein an $MAPbBr_3$/PS composite thin film had a fluorescence quantum yield of up to 48% and could be placed in water for 60 days without decomposition. The research team of Jiuyang Zhang added a polymer in the process of a precipitation method for production of CsPbBr$_3$ quantum dots, and composites CsPbBr$_3$/polymethyl methacrylate, CsPbBr$_3$/polybutylmethacrylate, and CsPbBr$_3$/polystyrene, were produced in situ, wherein CsPbBr$_3$/polymethyl methacrylate had a fluorescence quantum efficiency of 62.4%. However, current researches in in situ production of perovskite quantum dot/polymer composite light-emitting thin films are mainly concentrated at green light-emitting thin films, while perovskite quantum dot composite light-emitting thin films emitting red light have relatively low fluorescence quantum yields and stabilities, which cannot satisfy the requirements for application.

At present, red light-emitting materials based on perovskite quantum dots mainly include CH$_3$NH$_3$PbI$_3$ (MAPbI$_3$), NH$_2$CHNH$_2$PbI$_3$ (FAPbI$_3$), and CsPbI$_3$, the band gaps of their bulk materials are less than 1.73 eV After these materials are produced into quantum dots, their band gaps will increase due to quantum confinement effect. However, the light-emitting wavelengths of periodo-perovskite quantum dots obtained at present are still usually greater than 650 nm, which limits their application in the field of display and the like. If it is required to further increase their band gaps and allow the wavelength of the light emitted to be subjected to blue shift to 620-630 nm, doping with Br and the like is desired. The introduction of doping ions will reduce the structural stability of the material, and phase separation of perovskite quantum dots mixed with halogens will occur after long-period use, thereby changing the position of the light emission peak of the quantum dot and deteriorating the property of display. Therefore, it is desired to seek for a new method to adjust the band gap of periodo-perovskite quantum dots.

SUMMARY

An object of the present application is to propose coating a surface of a γ-CsPbI$_3$ quantum dot generated in the process of in situ production of a γ-CsPbI$_3$/polymer composite light-emitting material. The energy band structure and the dielectric constant of the coated quantum dot have changed, allowing an increased band gap and blue shift of the position of the light emission peak. By optimization of production parameters, a composite light-emitting thin film having a light emission peak between 610-680 nm, a full width at half maximum of less than 32 nm, a fluorescence quantum yield of greater than 80%, and a high stability may be obtained, which solves the current problem that it is difficult for red-light CsPbI$_3$ periodo-perovskite quantum dots to be used in optoelectronic devices such as backlight displays and the like.

According to one aspect of the present application, there is provided a composite light-emitting material, wherein the energy band structure and the dielectric constant of the coated/passivated quantum dot has changed, allowing an increased band gap and blue shift of the position of the light emission peak.

The composite light-emitting material is characterized in that the composite light-emitting material comprises a perovskite nanomaterial and a matrix;
the perovskite nanomaterial comprises γ-CsPbI$_3$ and an addition element M; and
the addition element M is selected from at least one of Li, Na, K, and Rb.
Optionally, the composite light-emitting material is a composite light-emitting thin film, a composite light-emitting block, or a composite light-emitting plate. The composite light-emitting material may be processed and molded into any desired shape.

Optionally, the perovskite nanomaterial is dispersed in the matrix.

Optionally, the perovskite nanomaterial is a core-shell structure;
a core is γ-CsPbI$_3$; and
a surface comprises the addition element M.

Optionally, the perovskite nanomaterial is a core-shell structure;
a core is γ-CsPbI$_3$; and
a surface comprises at least one of MPbX$_3$ and M$_4$PbX$_6$, wherein M is selected from at least one of Li, Na, K, and Rb and X is selected from at least one of halogens.

Optionally, the perovskite nanomaterial is a core-shell structure;
a core is γ-CsPbI$_3$; and
a surface is RbPbI$_3$.

Optionally, the composite light-emitting material is a red light-emitting material.

Optionally, the composite light-emitting material has a light emission peak at 600-680 nm.

Optionally, the composite light-emitting material has a light emission peak at 620-635 nm.

Optionally, a molar ratio of γ-CsPbI$_3$ to the addition element M in the perovskite nanomaterial is 1:0.01-10.

Optionally, a molar ratio of γ-CsPbI$_3$ to the addition element M in the perovskite nanomaterial is 1:0.2-0.5.

Optionally, γ-CsPbI$_3$ in the perovskite nanomaterial has a morphology selected from at least one of a γ-CsPbI$_3$ quantum dot, a γ-CsPbI$_3$ nanosheet, and a γ-CsPbI$_3$ nanowire.

Optionally, the perovskite nanomaterial has a size of 2-50 nm in at least one dimension.

Optionally, γ-CsPbI$_3$ in the perovskite nanomaterial is a γ-CsPbI$_3$ quantum dot particle; and
the γ-CsPbI$_3$ quantum dot particle has an average particle diameter of 14 nm.

Optionally, the matrix is a polymer.

Optionally, the polymer is selected from at least one of polyvinylidene fluoride, a copolymer of polyvinylidene fluoride and trifluoroethylene, polyvinyl acetate, cellulose acetate, cyanocellulose, polysulfone, aromatic polyamide, polyimide, polycarbonate, polystyrene, and polymethyl methacrylate.

Optionally, a mass ratio of the perovskite nanomaterial to the matrix is 1:1-100.

Optionally, a mass ratio of the matrix to the perovskite nanomaterial is 1:1-30.

Optionally, the composite light-emitting material further comprises an additive dispersed in the matrix; and
the additive is selected from at least one of zinc bromide, zinc iodide, stannous bromide, stannous iodide, cadmium bromide, and cadmium iodide.

Optionally, a mass ratio of the matrix to the additive is 1:0.001-0.5.

Optionally, the perovskite nanomaterial further comprises a surface ligand formed on a surface of γ-CsPbI$_3$; and
the surface ligand contains at least one of an organic acid, a halogenated organic acid, a C$_4$-C$_{24}$ organic amine, and a halogenated C$_4$-C$_{24}$ organic amine.

Optionally, a mass ratio of the sum by mass of PbI$_2$+CsI+M to the surface ligand is 1:0.001-1.

Optionally, the composite light-emitting material is a composite light-emitting thin film; and
the composite light-emitting thin film has a thickness of 0.001-5 mm.

Particularly, the γ-CsPbI$_3$ perovskite nanomaterial is a γ-CsPbI$_3$ perovskite quantum dot; and the γ-CsPbI$_3$ quantum dot has a size of no greater than 20 nm in at least one dimension.

The γ-CsPbI$_3$ quantum dot has a core and the core has a structural formula of CsPbI$_3$, wherein Pb and I form a coordinated octahedronal structure and Cs in filled in an orthogonal structure phase formed in a gap of the octahedronal structure. In the crystal structure of γ-CsPbI$_3$, bond angles $\alpha=\beta=\gamma=90°$ and bond lengths a=8.312-8.912 Å, b=8.815-8.745 Å, and c=12.494-12.824 Å. A γ-CsPbI$_3$ quantum dot having a better light-emitting property may be thereby obtained.

According to another aspect of the present application, there is provided a production method for the composite light-emitting material described above.

The production method for the composite light-emitting material is characterized by comprising steps of:
(1) obtaining a precursor solution containing a matrix, a perovskite precursor, and a compound containing an addition element M; and
(2) molding the precursor solution to obtain a modified perovskite nanomaterial.

Optionally, the matrix in step (1) is a polymer; and
the polymer is selected from at least one of polyvinylidene fluoride, a copolymer of polyvinylidene fluoride and trifluoroethylene, polyvinyl acetate, cellulose acetate, cyanocellulose, polysulfone, aromatic polyamide, polyimide, polycarbonate, polystyrene, and polymethyl methacrylate.

Optionally, the precursor solution in step (1) further contains a solvent; and
the solvent is selected from at least one of N,N-dimethylformamide, dimethyl sulfoxide, trimethyl phosphate, triethyl phosphate, N-methylpyrrolidone, and dimethylacetamide.

Optionally, the addition element M is derived from a compound containing the addition element M; and
the compound containing the addition element M is selected from at least one of LiCl, NaCl, KCl, RbCl, LiBr, NaBr, KBr, RbBr, LiI, NaI, KI, RbI, Li$_2$CO$_3$, Na$_2$CO$_3$, K$_2$CO$_3$, Rb$_2$CO$_3$, a Li metal-organic matter, a Na metal-organic matter, a K metal-organic matter, and a Rb metal-organic matter.

Optionally, step (1) comprises:
(s11) obtaining a solution A containing the matrix;
(s12) obtaining a solution B containing CsI, PbI$_2$, and the addition element M;
(s13) mixing the solution A and the solution B to obtain the precursor solution.

Optionally, a molar ratio of PbI$_2$ to (CsI+M) in the solution B is 1:0.1-3;
a molar ratio of CsI to M is 1:0.01-10; and
a mass ratio of the solvent:(PbI$_2$+CsI+M) is 1:0.001-3.

Optionally, a mass ratio of the matrix and the solvent in the solution A is 1:1-100.

Optionally, a mass ratio of the solution A and the solution B is 1:0.02-5.

Optionally, a mass ratio of the matrix and the solvent in the solution A is 1:1, 1:3, 1:4, 1:5, 1:6, 1:7, 1:8, 1:9, 1:10, 1:12, 1:15, 1:20, 1:30, 1:40, 1:50, 1:60, 1:70, 1:80, 1:90, 1:100, or a range value between any two ratios.

Optionally, a molar ratio of PbI$_2$ to (CsI+M) in the solution B is 1:0.1, 1:0.4, 1:0.5, 1:0.6, 1:0.75, 1:0.9, 1:1, 1:1.1, 1:1.5, 1:2, 1:3, or a range value between any two ratios.

Optionally, a mass ratio of the solvent B to (PbI$_2$+CsI+M) is 1:0.001, 1:0.01, 1:0.03, 1:0.045, 1:0.05, 1:0.1, 1:0.2, 1:0.8, 1:0.9, 1:1, 1:3, or a range value between any two ratios.

Optionally, a mass ratio of the solution A to the solution B in step (s13) is 1:0.02, 1:0.1, 1:0.5, 1:0.6, 1:0.8, 1:1, 1:2, 1:3, 1:5, or a range value between any two ratios.

Optionally, the solution A further comprises an additive, and the additive is selected from at least one of zinc bromide, zinc iodide, stannous bromide, stannous iodide, cadmium bromide, and cadmium iodide.

Optionally, a mass ratio of the matrix to the additive is 1:0.001-0.5.

Optionally, a mass ratio of the matrix to the additive in the solution A is 1:0.001, 1:0.003, 1:0.01, 1:0.015, 1:0.4, 1:0.5, or a range value between any two ratios.

Optionally, the precursor solution further comprises a surface ligand;
the surface ligand contains at least one of an organic acid, a halogenated organic acid, a $C_4$-$C_{24}$ organic amine, and a halogenated $C_4$-$C_{24}$ organic amine; and
the surface ligand is added in step (s12).

Optionally, a mass ratio of (PbI$_2$+CsI+M) to the surface ligand in the precursor solution is 1:0.001-5.

Optionally, a mass ratio of (PbI$_2$+CsI+M) to the surface ligand in the solution B is 1:0.001, 1:0.015, 1; 0.01, 1:0.02, 1:0.1, 1:0.6, 1:1, 1:2, 1:3, 1:4, 1:5, or a range value between any two ratios.

Optionally, the molding in step (2) comprises:
transferring the precursor solution to a template and molding to obtain the composite light-emitting material.

Optionally, the transferring comprises at least one of a spin coating method, an immersing and pulling method, an electrospinning method, a solution deposition method, a spray coating method, a film wiping method, and a casting method.

Optionally,
the molding in step (2) comprises drying; and
conditions of the drying include a temperature of 80-180° C. and a duration of 0.1-48 h.

Optionally, conditions of the drying further include: a pressure of 0.01-0.1 MPa.

Optionally, the pressure of the drying has an upper limit selected from 0.02 Mpa, 0.03 Mpa, 0.04 Mpa, 0.05 Mpa, 0.06 Mpa, 0.07 Mpa, 0.08 Mpa, 0.09 Mpa, or 0.1 Mpa; and a lower limit selected from 0.01 Mpa, 0.02 Mpa, 0.03 Mpa, 0.04 Mpa, 0.05 Mpa, 0.06 Mpa, 0.07 Mpa, 0.08 Mpa, or 0.09 Mpa.

Optionally, the temperature of the drying has an upper limit selected from 90° C., 100° C., 110° C., 120° C., 130° C., 140° C., 150° C., 160° C., 170° C., or 180° C.; and a lower limit selected from 80° C., 90° C., 100° C., 110° C., 120° C., 130° C., 140° C., 150° C., 160° C., or 170° C.

Optionally, the duration of the drying has an upper limit selected from 1 h, 2 h, 3 h, 4 h, 5 h, 6 h, 8 h, 10 h, 15 h, 24 h, 28 h, 32 h, 35 h, 40 h, or 48 h; and a lower limit selected from 0.1, 0.5 h, 1 h, 2 h, 3 h, 4 h, 5 h, 6 h, 8 h, 10 h, 15 h, 24 h, 28 h, 32 h, 35 h, or 40 h.

Particularly, the production method for the modified perovskite nanomaterial is characterized by comprising following steps.

(1) Dissolving a Polymer Material of a Matrix in a Solvent:
The organic solvent comprises at least one of N,N-dimethylformamide (DMF), dimethyl sulfoxide (DMSO), trimethyl phosphate (TMP), triethyl phosphate (TEP), N-methylpyrrolidone (NMP), and dimethylacetamide (DMAc). The matrix is composed of an organic polymer, and the polymer may be at least one of polyvinylidene fluoride (PVDF), a copolymer of polyvinylidene fluoride and trifluoroethylene (P(VDF-TrFE)), polyacrylonitrile (PAN), polyvinyl acetate (PVAc), cellulose acetate (CA), cyanocellulose (CNA), polysulfone (PSF), aromatic polyamide (PA), polyimide (PI), polycarbonate (PC), polystyrene (PS), and polymethyl methacrylate (PMMA). The mass ratio of the matrix to the organic solvent is 1:(1-50). The material of the matrix is mixed with the organic solvent under mechanical stirring until the material of the matrix is completely dissolved in the organic solvent to generate a clear and transparent solution.

The polymer matrix has functions in a γ-$CsPbI_3$ quantum dot/polymer composite light-emitting material mainly in three aspects. Firstly, the polymer matrix has a function of limiting the size of the γ-$CsPbI_3$ quantum dot in the process of the in situ generation of the γ-$CsPbI_3$ quantum dot. Due to the existence of the polymer matrix, the γ-$CsPbI_3$ quantum dots generated are separated and cannot continue to grow to become large particles. The particle size of the γ-$CsPbI_3$ quantum dot is finally limited to 20 nm or less. Secondly, the polymer matrix has a function of limiting the phase transition of the γ-$CsPbI_3$ quantum dot. When a γ-$CsPbI_3$ quantum dot/polymer composite thin film is cooled from production temperature to room temperature, $CsPbI_3$ quantum dots has a trend of spontaneous conversion from γ phase to δ phase. However, the volume of the unit cell of $CsPbI_3$ will increase in the process of conversion from γ phase to δ phase. At this time, the space provided to γ-$CsPbI_3$ quantum dots by the polymer is not increased, which limits the conversion from γ-$CsPbI_3$ quantum dots to δ-$CsPbI_3$, so that $CsPbI_3$ in the polymer composite thin film is still γ phase at room temperature. Thirdly, the polymer matrix can inhibit $CsPbI_3$ quantum dots from being brought into contact with $H_2O$ and $O_2$, so that the optical activity of $CsPbI_3$ quantum dots will not be easily lost due to decomposition and the stability of the γ-$CsPbI_3$ quantum dot/polymer composite thin film is enhanced.

The production process of the solution A employs a high-speed stirrer for dispersion. Therefore, the uniformity and the dispersibility of the solution A may be further improved and the effect of the composite may be in turn improved. The solution A may be produced by the steps of: dissolving a matrix and an additive in an organic solvent, wherein the mass ratio of the matrix to the organic solvent is 1:(1-30) and the mass ratio of the matrix to the additive is 1:(0.01-0.5); mixing under mechanical stirring for 12 h, so that the matrix and the additive are completely dissolved in the organic solvent, and thereby obtaining a clear and transparent solution, i.e., obtaining the solution A.

(2) Obtaining a solution B $PbI_2$, CsI, and an addition element M are dissolved in an organic solvent to obtain a solution B in this step. The organic solvent B comprises at least one selected from DMF, DMSO, TMP, TEP, NMP, and DMAc. The organic solvent B is miscible with the organic solvent A. As to be indicated, the term "miscible" refers in particular to the case that there is no phenomenon of layering of the mixed solution when the organic solvent A is mixed with the organic solvent B. Therefore, the solution A and the solution B may be mixed to form a uniform organic solvent system. That is, the solubilities of raw material components dissolved in the solution A and the solution B, such as $PbI_2$, CsI, the addition element M, the surface ligand, the polymer matrix, the additive, and the like, in the organic solvent A are not significantly different from those in the organic solvent B, and there is no phase separation in either macroscopic or microscopic structure. Here, the molar ratio of $PbI_2$ to (CsI+M) may be 1:(0.1-3), and the mass ratio of the organic solvent B to ($PbI_2$+CsI+M) may be 1:(0.001-1).

In order to further improve the properties of the composite light-emitting material obtained by using this method, an organic ligand is added to the solution. The surface ligand is an organic acid, a long-chain organic amine, or a halide thereof. Particularly, the organic acid may include saturated alkyl acids or unsaturated alkyl acids having a carbon atom number of at least 3; the long-chain organic amine may be an alkylamine or an aromatic amine having 4-24 carbon atoms; and the halide of the organic acid or the organic amine is the corresponding halide of the organic acid or the organic amine. In the precursor solution, the mass ratio of $PbI_2$+CsI+M to the organic ligand is 1:(0.001-1).

The addition of the organic ligand can eliminate the defects in the surface of the γ-$CsPbI_3$ quantum dot generated, reduce non-radiative recombination, and improve the fluorescence quantum yield of the γ-$CsPbI_3$ quantum dot. Additionally, the organic ligand and the γ-$CsPbI_3$ quantum dot have different binding energies on different crystallographic planes, and the growth direction of γ-$CsPbI_3$ may be thereby controlled, so as to achieve the purpose of regulating the morphology of γ-$CsPbI_3$ generated (quantum dots, nanosheets, nanowires).

In order to further improve the properties of the composite light-emitting material obtained by using this method, an additive may further added to the solution. The additive includes at least one of zinc bromide, zinc iodide, stannous bromide, stannous iodide, cadmium bromide, and cadmium iodide. The mass ratio of the matrix to the additive may be 1:(0.001-0.5).

The addition of the additive can reduce the nucleation rate of the γ-$CsPbI_3$ quantum dot, so that the size of the γ-$CsPbI_3$ quantum dot generated is more uniform, so as to obtain a γ-$CsPbI_3$ quantum dot/polymer composite thin film having a narrower full width at half maximum. Secondly, the additive serves as a fluxing agent in the process of generation of γ-$CsPbI_3$, which reduces the generation temperature of γ-$CsPbI_3$ from 175° C. to 80° C. and reduces the processing difficulty of polymer thin films. (This additive may be still present; the position of the light emission peak will not shift after addition, but the full width at half maximum will be further narrowed, and the light emission intensity and the light emission efficiency will be both improved.)

In order to regulate the band gap of the resultant γ-$CsPbI_3$ quantum dot, a coating agent is added to the raw materials. The coating agent includes alkali metal halides (LiX, NaX, KX, RbX, X=Cl, Br, I), alkali metal carbonate ($Li_2CO_3$, $Na_2CO_3$, $K_2CO_3$, $Rb_2CO_3$), Li metal-organic matters, Na metal-organic matters, K metal-organic matters, and Rb metal-organic matters. Since the coating agent has a cation with a small radius and the product generated by its reaction with $PbI_2$ has a tolerance factor of less than 0.8 and a material having a perovskite structure cannot be generated, the cation of the coating agent cannot be incorporated into a $CsPbI_3$ quantum dot to generate a doped quantum dot, but can only coat and passivate the surface of the $CsPbI_3$ quantum dot, so as to increase the quantum confinement effect and the dielectric confinement effect of the $CsPbI_3$ quantum dot. The band gap of the $CsPbI_3$ quantum dot is thereby finally increased, and the light emission peak is subjected to blue shift. Additionally, by coating the surface of the $CsPbI_3$ quantum dot with an inorganic material, it is possible to further enhance the stability of the $CsPbI_3$ quantum dot and promote the practical application of this polymer composite thin film.

(3) Forming a Precursor Solution

According to examples of the present invention, the solution A is mixed with the solution B in this step to obtain a precursor solution. Particularly, the mass ratio of the solution A to the solution B is 1:(0.02-5), and mechanical stirring is performed for 2 h to obtain a precursor solution.

(4) Transferring

In this step, a uniformly mixed precursor solution is transferred to a template by a suitable method, so as to form composites having different shapes. Here, the template may be a mold or substrate having a specific shape. A particular mold may be designed by those skilled in the art according to the particular requirements for the shape of the composite light-emitting material in a practical application. Particularly, methods for transferring a precursor solution to a substrate or a mold may include a spin coating method, an immersing and pulling method, an electrospinning method, a solution deposition method, a spray coating method, a film wiping method, or a casting method. Therefore, a composite light-emitting material having a shape of thin film and the like may be conveniently obtained.

(5) Drying

In this step, the template having the precursor solution is dried, so as to obtain the composite light-emitting material. Particularly, a template to which a precursor solution is attached may be placed in a vacuum drying oven to remove the organic solvent in the precursor solution under certain conditions. Thus, the conditions of volatilization of this organic solvent system may be controlled to control the crystallization of the matrix, the arrangement of the additive, the nucleation and the growth of $\gamma$-$CsPbI_3$ quantum dot particles, so as to improve the properties of the composite. For example, according to specific examples of the present invention, the pressure may be between 0.01-0.1 MPa and the temperature may be between 80-180° C. in the vacuum drying oven, and the composite based on $\gamma$-$CsPbI_3$ quantum dot particles obtained by drying treatment for 0.1-48 h may have a thickness of 0.001-5 mm. $\gamma$-$CsPbI_3$ quantum dots having different particle diameter distributions may be obtained at different drying temperatures. Therefore, the light-emitting wavelength of the resultant $\gamma$-$CsPbI_3$ quantum dot/polymer composite light-emitting thin film may be controlled to cover 600-680 nm.

According to yet another aspect of the present application, there is provided a semiconductor device.

The semiconductor device is characterized by comprising at least one of the composite light-emitting materials described above and the composite light-emitting material produced by the production method for the composite light-emitting material described above.

Optionally, the semiconductor device comprises an electroluminescent device, a photoluminescent device, a solar cell, a display device, a sensing device, a piezoelectric device, and a non-linear optical device.

According to yet another aspect of the present application, there is provided a flexible device.

The flexible device is characterized by comprising at least one of the composite light-emitting materials described above and the composite light-emitting material produced by the production method for the composite light-emitting material described above.

Optionally, the flexible device comprises a substrate, a metal anode, a hole transport layer, a light-emitting layer, an electron transport layer, and a metal cathode; and The substrate comprises at least one of the composite light-emitting materials described above and the composite light-emitting material produced by the production method for the composite light-emitting material described above.

According to yet another aspect of the present application, there is provided a bichromatic composite light-emitting material.

The bichromatic composite light-emitting material is characterized by comprising a green light-emitting thin film and a red light-emitting thin film, which are laminated; and the red light-emitting thin film comprising at least one of the composite light-emitting materials described above and the composite light-emitting material produced by the production method for the composite light-emitting material described above.

Optionally, the red light-emitting thin film is a $RbPbI_3$ coated $\gamma$-$CsPbI_3$ quantum dot/polymethyl methacrylate composite thin film.

Optionally, the green light-emitting thin film is a $CH_3NH_3PbBr_3$ quantum dot/polyvinylidene fluoride composite thin film.

According to yet another aspect of the present application, there is provided an LCD display.

the LCD display is characterized by comprising at least one of the bichromatic composite light-emitting materials described above.

According to yet another aspect of the present application, there is provided a photoluminescent device.

The photoluminescent device is characterized by comprising a blue light chip drive module, a blue light chip heat dissipation module, and a bichromatic composite light-emitting material; and the bichromatic composite light-emitting material comprising at least one selected from the bichromatic composite light-emitting materials described above.

The advantageous effects brought about by the present application include the followings.

1) The energy band structure and the dielectric constant of the coated/passivated quantum dot provided by the present application have changed, resulting in an increased band gap and blue shift of the position of the light emission peak. By optimization of production parameters, a composite light-emitting thin film having a light emission peak between 600-680 nm, a full width at half maximum of less than 32 nm, a fluorescence quantum yield of greater than 80%, and a high stability may be obtained, which solves the current problem that it is difficult for red-light $CsPbI_3$ periodo-perovskite quantum dots to be used in optoelectronic devices such as backlight displays and the like.

2) The $CsPbI_3$ quantum dot provided by the present application has a surface coated by an inorganic material, which may further enhances the stability of the $CsPbI_3$ quantum dot and promote the practical application of this polymer composite thin film.

DESCRIPTION OF EMBODIMENTS

The present application will be described in detail below in conjunction with Examples, but the present application is not limited to these Examples.

Unless specifically demonstrated, raw materials in Examples of the present application were all commercially purchased.

Analytical methods in Examples of the present application were as follows.

XRD analysis was performed by using a PANalytical X'Pert3 powder diffractometer.

Transmission spectrum analysis was performed by using a Varian Cary 5 spectrophotometer.

Fluorescence emission spectrum analysis was performed by using an FLSP920 fluorescence spectrometer.

Example 1

(1) A polymer was dissolved in an organic solvent with controlling the mass ratio of polymer:organic solvent=1:3. An additive, ZnCl$_2$, was added wherein the mass ratio of the polymer to ZnCl$_2$ was 1:0.01. Mechanical stirring was performed for no less than 6 h, so that the polymer was completely dissolved in the organic solvent, thereby obtaining a clear and transparent solution, which was a solution A. The polymer was polymethyl methacrylate (PMMA); and the organic solvent was N,N-dimethylformamide (DMF).

(2) PbI$_2$ powder, CsI powder, and RbI powder were mixed, the molar ratio was controlled to be PbI$_2$:(CsI+RbI)=1:1 and CsI:RbI=1:1. An organic solvent was added, and the mass ratio was controlled to be organic solvent:(PbI$_2$+CsI+RbI)=1:0.045. An organic ligand, octylamine bromide, was further added, and the mass ratio of (PbI$_2$+CsI+RbI) to the organic ligand was controlled to be 1:0.15. After mixing, mechanical stirring was performed for 6 h to obtain a clear and transparent solution, which was a solution B. The organic solvent in this step was N,N-dimethylformamide (DMF).

(3) The solution A in step (1) was mixed with the solution B in step (2), the mass ratio was controlled to be solution A:solution B=1:0.5, and mechanical stirring was performed for 24 h to obtain a uniformly mixed precursor solution.

Figure 1:
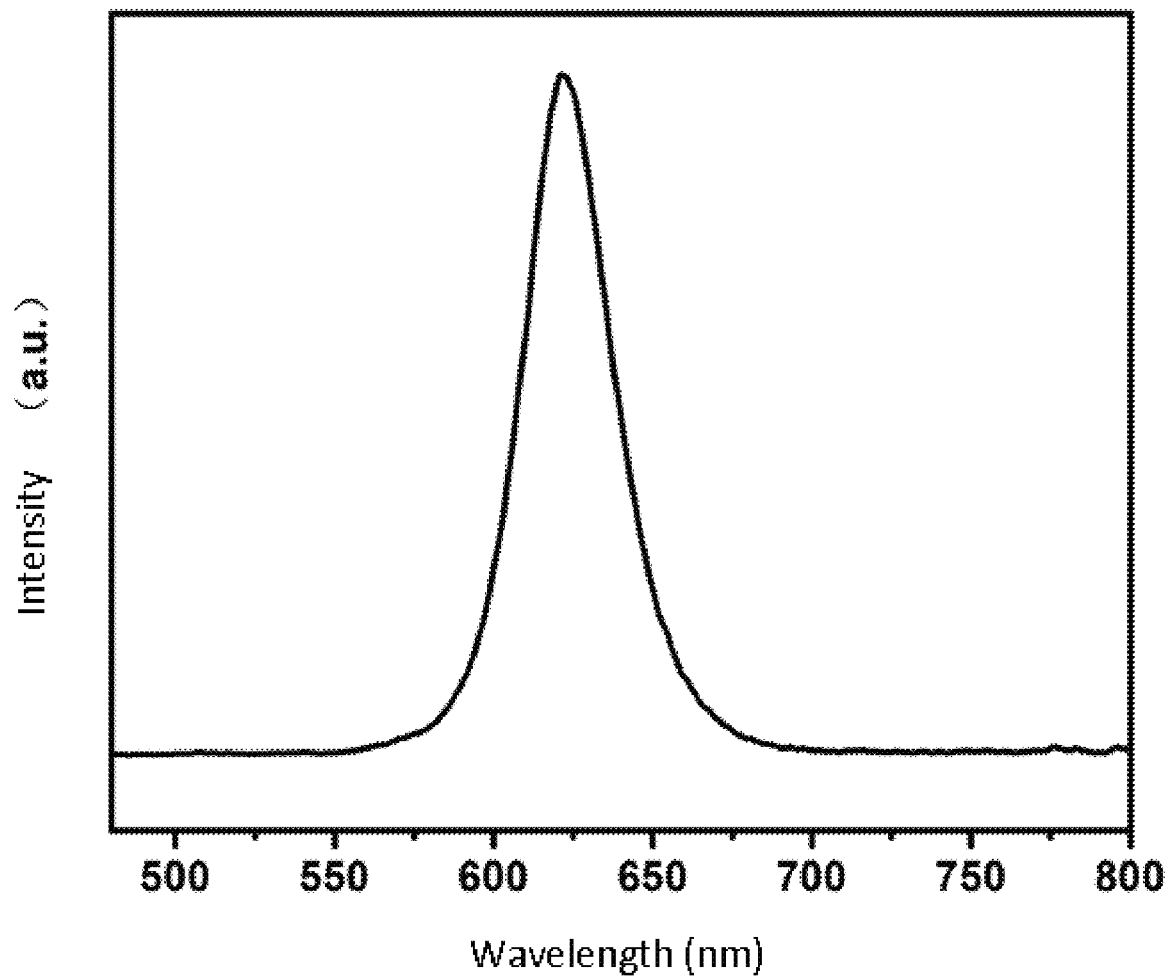
FIG. 1 is a fluorescence emission spectrum of a $\gamma$-$CsPbI_3$/$RbPbI_3$ core-shell structure quantum dot/polymer composite light-emitting thin film produced in Example 1.
Figure 2:
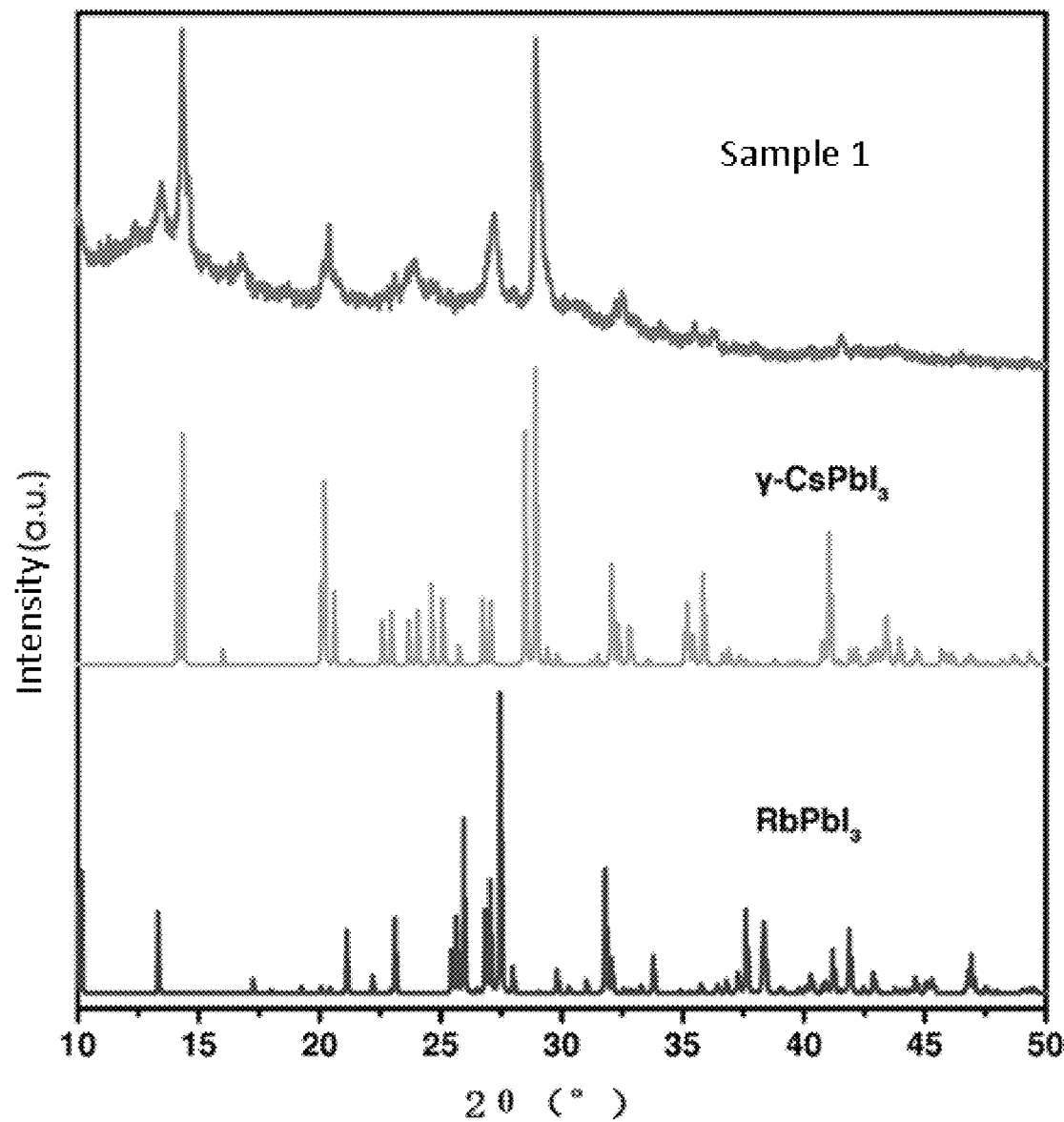
FIG. 2 is an XRD spectrogram of a $\gamma$-$CsPbI_3$/$RbPbI_3$ core-shell structure quantum dot/polymer composite light-emitting thin film produced in Example 1.

(4) The precursor solution in step (3) described above was transferred to a transparent glass sheet by a spin coating method for uniform distribution of the precursor solution. Spin coating was performed for 30 seconds by controlling the rotation speed of a spin coating apparatus to be 1500 rpm, so that the thickness of the precursor solution on the transparent glass sheet was about 0.05 mm. The transparent glass sheet coated with the precursor solution was then placed in a vacuum drying oven having a pressure of 0.1 MPa and a temperature of 50° C. for 10 min, to remove the organic solvent. The glass sheet with the solvent removed was then withdrawn from the vacuum drying oven and placed on a heating plate at 130° C. for 30 min. γ-CsPbI$_3$ quantum dots were first in situ generated in a PMMA matrix. After CsI was consumed, RbI reacted with PbI$_2$ to generate RbPbI$_3$ coating on γ-CsPbI$_3$, to obtain a γ-CsPbI$_3$/RbPbI$_3$ core-shell structure quantum dot/PMMA composite thin film. It was marked as sample 1. FIG. 1 is a fluorescence emission spectrum of the sample 1, wherein the light emission peak was located at 621 nm, the full width at half maximum was 32 nm, and the fluorescence quantum yield was 87%. FIG. 2 is an XRD pattern of the sample 1, the peak occurring at 13.3° is the diffraction peak of RbPbI$_3$, and the other peaks are diffraction peaks of γ-CsPbI$_3$.

Example 2

Figure 3:
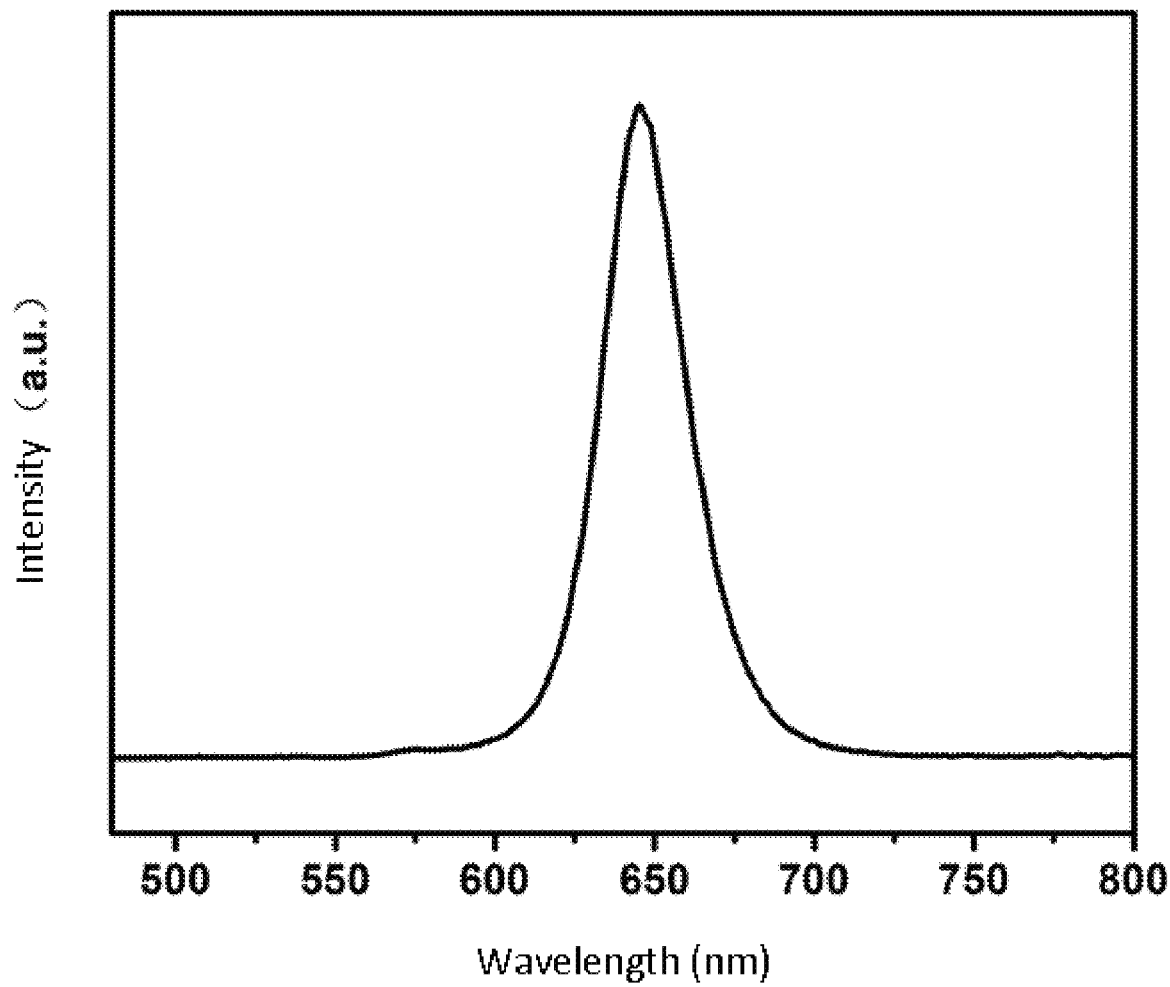
FIG. 3 is a fluorescence emission spectrum of a $\gamma$-$CsPbI_3$/$RbPbI_3$ core-shell structure quantum dot/polymer composite light-emitting thin film produced in Example 2.
Figure 4:
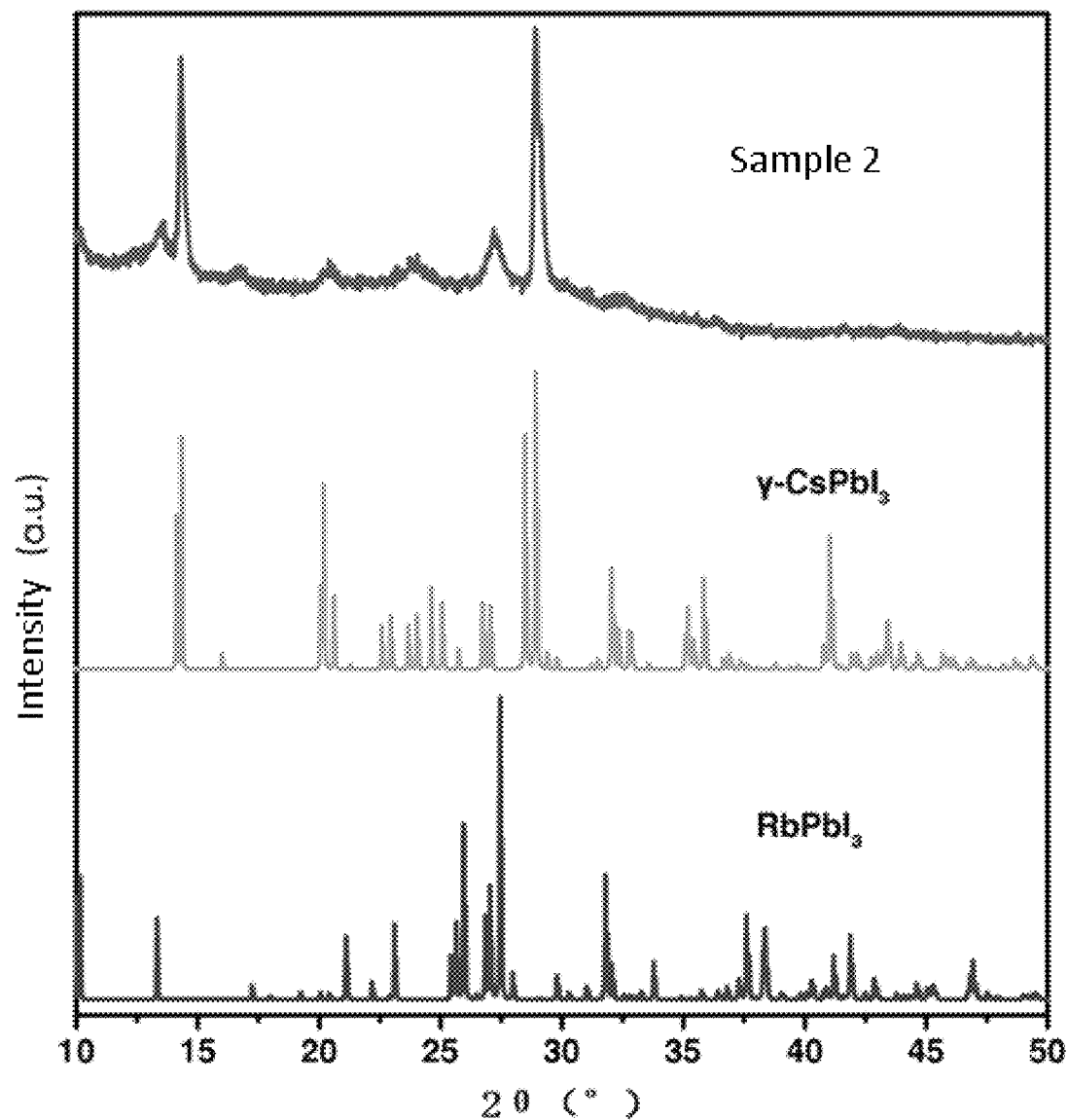
FIG. 4 is an XRD spectrogram of a γ-CsPbI$_3$/RbPbI$_3$ core-shell structure quantum dot/polymer composite light-emitting thin film produced in Example 2.

The steps were the same as those of Example 1 except for the followings. In the solution A, the mass ratio of the polymer to the organic solvent was controlled to be 1:30. In the solution B, the mass ratio of the organic solvent:(PbI$_2$+CsI+RbI) was controlled to be 1:1, and the molar ratio of CsI to RbI was 1:0.2. The solutions were uniformly mixed by mechanical stirring and placed on a heating plate at 110° C. for 30 min after the solvent was removed from the vacuum drying oven to obtain a γ-CsPbI$_3$/RbPbI$_3$ core-shell structure quantum dot/PMMA composite thin film, which was marked as sample 2. FIG. 3 is a fluorescence emission spectrum of the sample 2, wherein the light emission peak was located at 647 nm, the full width at half maximum was 31 nm, and the fluorescence quantum yield was 92%. FIG. 4 is an XRD pattern of the sample 2, the peak occurring at 13.3° is the diffraction peak of RbPbI$_3$, and the other peaks are diffraction peaks of γ-CsPbI$_3$.

Example 3

Figure 5:
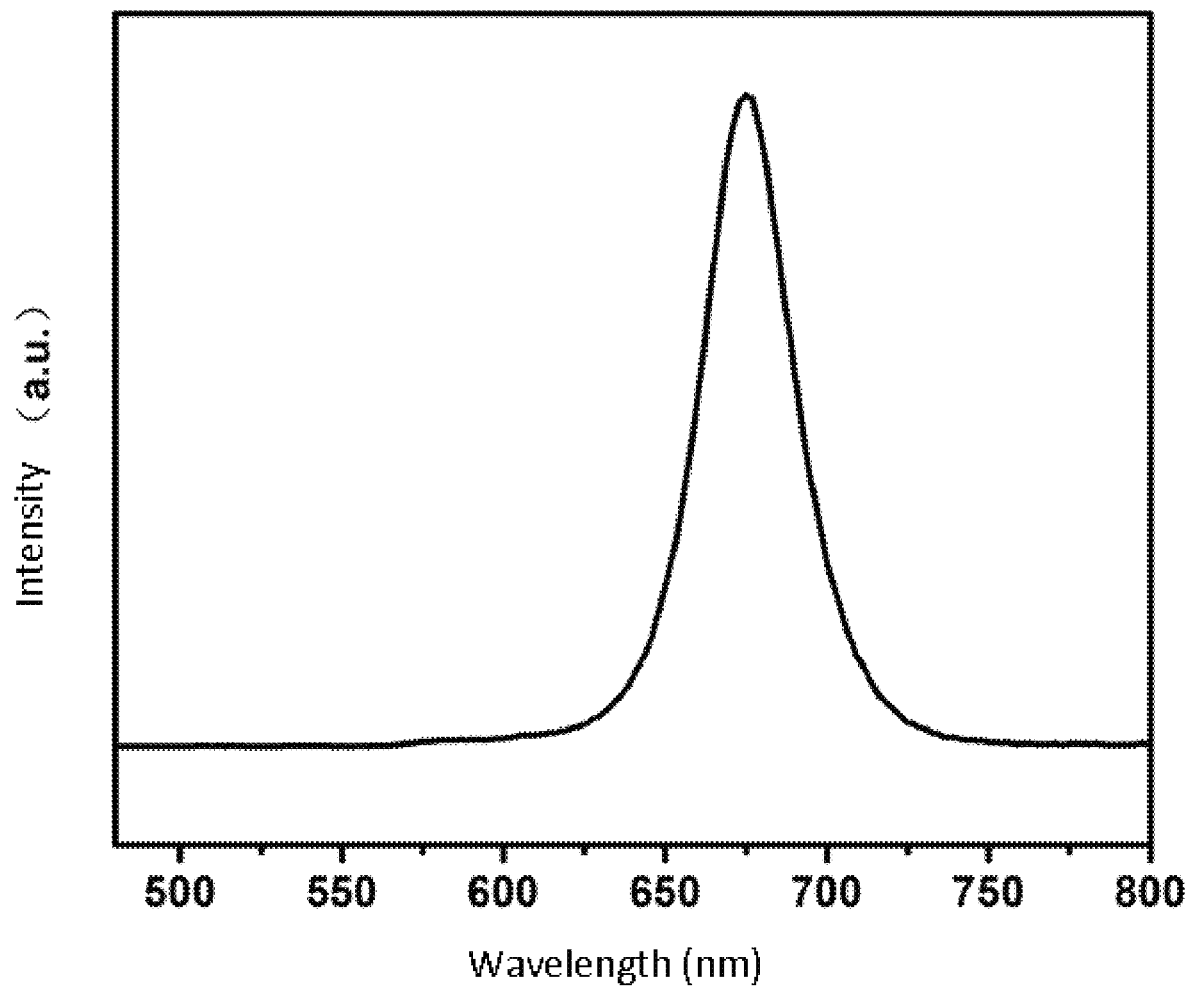
FIG. 5 is a fluorescence emission spectrum of a γ-CsPbI$_3$/RbPbI$_3$ core-shell structure quantum dot/polymer composite light-emitting thin film produced in Example 3.
Figure 6:
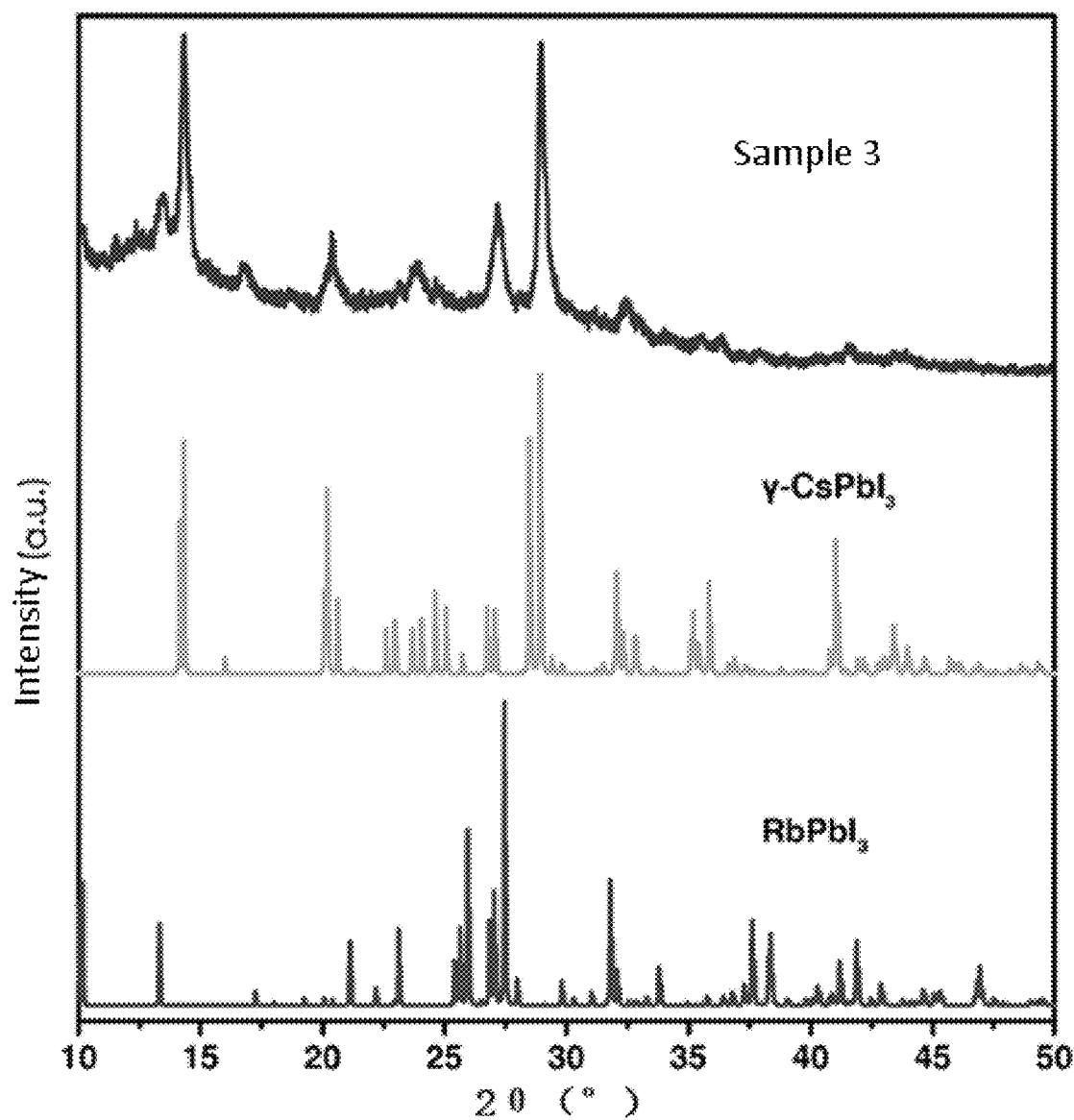
FIG. 6 is an XRD spectrogram of a γ-CsPbI$_3$/RbPbI$_3$ core-shell structure quantum dot/polymer composite light-emitting thin film produced in Example 3.

The steps were the same as those of Example 1 except for the followings. The mass ratio of the polymer to the organic solvent was controlled to be 1:10, an additive, CdI$_2$, was added, and the mass ratio of the polymer to the additive was 1:0.05. In the solution B, the mass ratio of the organic solvent:(PbI$_2$+CsI+RbI) was controlled to be 1:3, and the molar ratio of CsI to RbI was 1:0.01. The solutions were uniformly mixed by mechanical stirring and placed on a heating plate at 150° C. for 30 min after the solvent was removed from the vacuum drying oven to obtain a γ-CsPbI$_3$/RbPbI$_3$ core-shell structure quantum dot/PMMA composite thin film, which was marked as sample 3. FIG. 5 is a fluorescence emission spectrum of the sample 3, wherein the light emission peak was located at 678 nm, the full width at half maximum was 34 nm, and the fluorescence quantum yield was 78%. FIG. 6 is an XRD pattern of the sample 3, the peak occurring at 13.3° is the diffraction peak of RbPbI$_3$, and the other peaks are diffraction peaks of γ-CsPbI$_3$.

Example 4

The steps were the same as those of Example 1 except for the followings. In the solution A, the polymer was polyacrylonitrile (PAN), the organic solvent was dimethyl sulfoxide (DMSO), the mass ratio of polymer:organic solvent was 1:6, an additive, ZnI$_2$, was added, the mass ratio was controlled to be polymer:ZnI$_2$=1:0.5, and mechanical stirring was performed for no less than 6 h to obtain a clear and transparent solution. In the solution B, the organic solvent was dimethyl sulfoxide (DMSO), the molar ratio of PbI$_2$:(CsI+Li$_2$CO$_3$) was controlled to be 1:0.5, the molar ratio of CsI to Li$_2$CO$_3$ was 1:0.005, and the mass ratio of organic solvent:(PbI$_2$+CsI+Li$_2$CO$_3$) was controlled to be 1:0.001. In the precursor solution, the mass ratio of solution A:solution B was controlled to be 1:1. The precursor solution was transferred to the transparent glass sheet by an immersing and pulling method, the thickness of the precursor solution on the transparent glass sheet was controlled to be 0.2 mm, the vacuum drying oven had a pressure of 0.01 MPa and a temperature of 30° C., and vacuum drying was performed for 1 h. The glass sheet with the solvent removed was then withdrawn from the vacuum drying oven and placed on a heating plate at 130° C. for 20 min to obtain a γ-CsPbI$_3$/LiPbI$_3$ core-shell structure quantum dot/PAN composite thin film.

Example 5

The steps were the same as those of Example 4 except for the followings. The mass ratio of organic solvent:(PbI$_2$+CsI+Li$_2$CO$_3$) was controlled to be 1:0.1, and the molar ratio of CsI to Li$_2$CO$_3$ was 1:0.1. The solutions were uniformly mixed by mechanical stirring and placed on a heating plate at 150° C. for 10 min after the solvent was removed from the vacuum drying oven to obtain a γ-CsPbI$_3$/LiPbI$_3$ core-shell structure quantum dot/PAN composite thin film.

Example 6

The steps were the same as those of Example 1 except for the followings. In the solution A, the polymer was polyvinylidene fluoride (PVDF), the organic solvent was trimethyl phosphate (TMP), and the mass ratio of polymer:organic solvent was controlled to be 1:15. In the solution B, the organic solvent was trimethyl phosphate (TMP), the mass ratio of the organic solvent to (PbI$_2$+CsI+NaBr) was controlled to be 1:0.2, the molar ratio of PbI$_2$ to (CsI+NaBr) was 1:0.1, and the molar ratio of CsI to NaBr was 1:0.001. The solution A and the solution B were uniformly mixed and stirred at a mass ratio of 1:0.02. The precursor solution was transferred to a glass dish by a solution deposition method, the thickness of the precursor solution on the glass dish was controlled to be 5 mm, the vacuum drying oven had a pressure of 0.05 MPa and a temperature of 110° C., and vacuum drying was performed for 10 h to obtain a γ-CsPbI$_3$/NaPbBr$_{0.1}$I$_{2.9}$ core-shell structure quantum dot/PVDF composite thin film.

Example 7

The steps were the same as those of Example 1 except for the followings. In the solution A, the mass ratio of the polymer, polymethyl methacrylate (PMMA), to N,N-dimethylformamide was 1:10, an additive, CdBr$_2$, was further added, the mass ratio of the polymer matrix to the additive was controlled to be 1:0.01, mixing was performed under mechanical stirring for no less than 6 h to obtain a clear and transparent solution. In the solution B, the organic solvent was N,N-dimethylformamide (DMF), the mass ratio of the organic solvent to (PbI$_2$+CsI+RbBr) was controlled to be 1:0.9, the molar ratio of PbI$_2$ to CsI was 1:3, and the molar ratio of CsI to RbBr was 1:5. In the precursor solution, the mass ratio of solution A:solution B was controlled to be 1:3. Mechanical stirring was performed for 18 h to obtain a clear and transparent precursor solution. The precursor solution was transferred to a glass dish by deposition, the thickness of the precursor solution on the glass dish was controlled to be 3 mm, the vacuum drying oven had a pressure of 0.05 MPa and a temperature of 150° C., and vacuum drying was performed for 8 h to obtain a γ-CsPbI$_3$/Rb$_4$PbBr$_3$I$_3$ core-shell structure quantum dot/PVDF composite thin film.

Example 8

The steps were the same as those of Example 7 except for the followings. In the solution A, the mass ratio of the polymer to the organic solvent was controlled to be 1:4, an additive, CdI$_2$, was added, and the mass ratio of the polymer to the additive, CdI$_2$, was controlled to be 1:0.01. Mechanical stirring was performed for no less than 6 h to obtain a clear and transparent solution. In the solution B, the molar ratio of PbI$_2$ to (CsI+RbCl) was controlled to be 1:0.5, the molar ratio of CsI to RbCl was 1:10, and the mass ratio of the solvent to (PbI$_2$+CsI+RbCl) was 1:0.01. Mechanical stirring was performed for no less than 6 h to obtain a clear and transparent solution. In the precursor solution, the mass ratio of the solution A to the solution B was controlled to be 1:0.1, and mechanical stirring was performed for 12 h. The precursor solution was transferred to a transparent PET sheet by an electrospinning method, the thickness of the precursor solution on the transparent PET sheet was controlled to be 2 mm, the vacuum drying oven had a pressure of 0.07 MPa and a temperature of 40° C., and drying was performed for 15 min to remove the organic solvent. The glass sheet with the solvent removed was then withdrawn from the vacuum drying oven and placed on a heating plate at 80° C. for 1 h, CsPbI$_3$ quantum dots were in situ generated in the PMMA matrix to obtain a γ-CsPbI$_3$/Rb$_4$PbCl$_6$ core-shell structure quantum dot/PMMA composite thin film.

Example 9

The steps were the same as those of Example 8 except for the followings. In the solution A, the polymer was polysulfone (PSF), the additive was ZnBr$_2$, and the mass ratio of the polymer to the additive was 1:0.003. In the solution B, the mass ratio of the organic solvent to (PbI$_2$+CsI+RbCl) was 1:0.03. The thickness of the precursor solution on the transparent PET sheet was controlled to be 0.5 mm when the precursor solution was transferred. A γ-CsPbI$_3$/RbPbI$_3$ core-shell structure quantum dot/PSF composite thin film attached to a transparent PET sheet was obtained.

Example 10

The steps were the same as those of Example 1 except for the followings. In the solution A, the polymer was polyvinylidene fluoride (PVDF), and the organic solvent was N,N-dimethylformamide (DMF). The mass ratio of polymer:organic solvent was controlled to be 1:15. In the solution B, the organic solvent was N,N-dimethylformamide (DMF), the mass ratio of the organic solvent to ($PbI_2$+CsI+ potassium phenylglycinate) was 1:0.1, the molar ratio of $PbI_2$:(CsI+N-potassium phenylglycinate) was 1:0.6, and the molar ratio of CsI to N-potassium phenylglycinate was 1:2. In the precursor solution, the mass ratio of the solution A to the solution B was controlled to be 1:0.1. The precursor solution was transferred to a transparent polycarbonate (PC) sheet by a spray coating method, the thickness of the precursor solution on the transparent polycarbonate (PC) sheet was controlled to be 1 mm, the vacuum drying oven had a pressure of 0.02 MPa and a temperature of 20° C., and drying was performed for 30 min to remove the solvent. The glass sheet with the solvent removed was then withdrawn from the vacuum drying oven and placed on a heating plate at 100° C. for 1 h to obtain a $\gamma$-$CsPbI_3$/$KPbI_3$ core-shell structure quantum dot/PVDF composite thin film attached to a transparent polycarbonate (PC) sheet.

Example 11

The steps were the same as those of Example 1 except for the followings. In the solution A, the mass ratio of the polymer to the organic solvent was 1:7, and the polymer was a mixture of polymethyl methacrylate (PMMA) and polyacrylonitrile (PAN) having a mass ratio of 1:1. An additive, $SnI_2$, was further added, and the mass ratio of the matrix to the additive was 1:0.4, Mechanical stirring was performed for no less than 6 h to obtain a clear and transparent solution. In the solution B, the mass ratio of the solvent to ($PbI_2$+CsI) was 1:0.8, octylamine iodide was further added as a ligand, and the mass ratio of ($PbI_2$+CsI+RbI) to octylamine iodide was 1:0.1. Mechanical stirring was performed for no less than 6 h to obtain a clear and transparent solution. The mass ratio of the solution A to the solution B was controlled to be 1:2, and mechanical stirring was performed for 18 h to obtain a uniformly mixed precursor solution. The precursor solution was transferred to a transparent polycarbonate (PC) sheet by a spray coating method to achieve uniform distribution, the thickness of the precursor solution on the transparent polycarbonate (PC) sheet was controlled to be 0.004 mm, the transparent polycarbonate (PC) sheet coated with the precursor solution was then placed in a vacuum drying oven which had a pressure of 0.1 MPa and a temperature of 50° C., and drying was performed for 20 min to remove the organic solvent. A $\gamma$-$CsPbI_3$/$RbPbI_3$ core-shell structure quantum dot/PMMA/PAN composite thin film attached to the transparent polycarbonate (PC) sheet was obtained.

Example 12

The steps were the same as those of Example 1 except for the followings. In the solution A, the additive used was $SnBr_2$, and the mass ratio of the polymer matrix to $SnBr_2$ was 1:0.01. In the solution B, the molar ratio of $PbI_2$:CsI was controlled to be 1:0.4, the surface ligand was pentanoic acid, and the mass ratio of ($PbI_2$+CsI+RbI) to pentanoic acid was 1:0.001. In the precursor solution, the mass ratio of the solution A to the solution B was controlled to be 1:2, and mechanical stirring was performed for no less than 24 h. The precursor solution was transferred to a transparent silica gel sheet by a casting method, the thickness of the precursor solution on the transparent silica gel sheet was controlled to be 1 mm, the vacuum drying oven had a pressure of 0.03 MPa and a temperature of 100'C, and drying was performed for 48 h to obtain a $\gamma$-$CsPbI_3$/$RbPbI_3$ core-shell structure quantum dot/PMMA composite thin film attached to a transparent silica gel sheet.

Example 13

The steps were the same as those of Example 12 except for the followings. In the solution A, the polymer was polyvinylidene fluoride (PVDF), the mass ratio of the organic solvent to polyvinylidene fluoride (PVDF) was 1:7, the additive was $ZnI_2$, and the mass ratio of the matrix to $ZnI_2$ was 1:0.015. In the solution B, the molar ratio of $PbI_2$ to (CsI+RbBr) was 1:1.1, the molar ratio of CsI to RbBr was 1:10, the surface ligand added was 3,5-dimethylaniline, and the mass ratio of ($PbI_2$+CsI+RbBr) to 3,5-dimethylaniline was 1:0.1. The mass ratio of the solution A to the solution B was controlled to be 1:1. A $\gamma$-$CsPbI_3$/$Rb_4PbBr_6$ core-shell structure quantum dot/PVDF composite thin film attached to a transparent silica gel sheet was obtained.

Example 14

The steps were the same as those of Example 1 except for the followings. In the solution A, an additive, $SnI_2$, was added, and the mass ratio of the matrix PMMA to $SnI_2$ was 1:0.4. In the solution B, the molar amount ratio of $PbI_2$ to (CsI+LiCl) was 1:0.9, the molar ratio of CsI to LiCl was 1:0.005, a surface ligand, dodecylamine iodide, was further added, and the mass ratio of ($PbI_2$+CsI+LiCl) to dodecylamine iodide was 1:1. A heating stage placed after coating had a temperature of 120° C. and a heating time of 40 min to obtain a $\gamma$-$CsPbI_3$/$LiPbCl_3$ core-shell structure quantum dot/ PMMA composite thin film.

Example 15

The steps were the same as those of Example 1 except for the followings. In the solution A, the mass ratio of the polymer matrix to the organic solvent was 1:10, the polymer was a polycarbonate (PC), and the organic solvent was N,N-dimethylformamide (DMF). In the solution B, the surface ligand added was acetic acid and dodecylamine, the mass ratio of acetic acid to dodecylamine was 1:3, the mass ratio of ($PbI_2$+CsI+RbI) to the surface ligand was 1:0.02, and the molar amount ratio of CsI to RbI was 1:8. In the precursor solution, the mass ratio of the solution A to the solution B was 1:0.8. The heating plate was controlled to have a heating temperature of 120° C., and drying was performed for 30 min to obtain a $\gamma$-$CsPbI_3$—RbI heterojunction structure quantum dot/PC composite thin film.

Example 16

The steps were the same as those of Example 1 except for the followings. In the solution A, the polymer matrix was polystyrene (PS), the mass ratio of the matrix to the organic solvent was 1:20, and the organic solvent was N,N-dimethylformamide (DMF). In the solution B, the surface ligand added was octylamine bromide, the mass ratio of ($PbI_2$+ CsI+KBr) to the surface ligand, octylamine bromide, was 1:0.6, and the molar amount ratio of CsI to KBr was 1:10. In the precursor solution, the mass ratio of the solution A to the solution B was 1:0.6. The precursor solution was transferred to a transparent quartz glass sheet by a spin coating method, the thickness of the precursor solution on the transparent quartz glass sheet was controlled to be 1 mm, the vacuum drying oven had a pressure of 0.1 MPa and a temperature of 130° C., and drying was performed for 72 h to obtain a γ-CsPbI$_3$—K$_4$PbBr$_6$ heterojunction structure quantum dot/PS composite.

Example 17

The steps were the same as those of Example 1 except for the followings. In the solution A, the mass ratio of the polymer to the organic solvent was controlled to be 1:10, the polymer was polyvinylidene fluoride (PVDF), and the organic solvent was dimethylacetamide (DMAc). In the solution B, the molar amount ratio of PbI$_2$:CsI was controlled to be 1:2, the organic solvent was dimethylacetamide (DMAc), the mass ratio of the organic solvent to (PbI$_2$+CsI+RbI) was 1:1.5, the organic ligand was pentanoic acid and 3-vinylethylamine, the mass ratio of pentanoic acid to 3-vinylethylamine was 1:5, and the mass ratio of (PbI$_2$+CsI) to the organic ligand was 1:0.01. The precursor solution was transferred to an ITO glass by a spin coating method, the thickness of the precursor solution on the ITO glass was controlled to be 0.1 mm, the vacuum drying oven had a pressure of 0.02 MPa and a temperature of 40° C., and drying was performed for 15 min to remove the organic solvent. The ITO glass sheet with the organic solvent removed was placed on a heating plate at 130° C. and baked for 45 min to obtain a rod-like γ-CsPbI$_3$/RbPbI$_3$ core-shell structure quantum dot/PVDF composite.

Example 18

Figure 7:
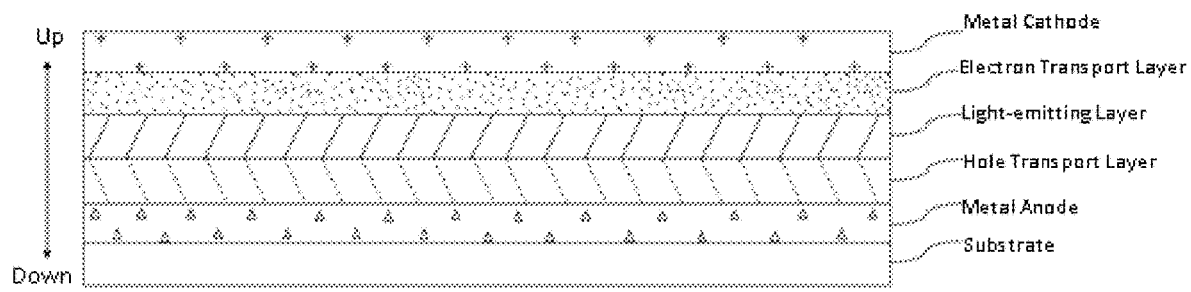
FIG. 7 is a structural schematic diagram of a flexible electroluminescent device in an Example according to the present application.
Figure 9:
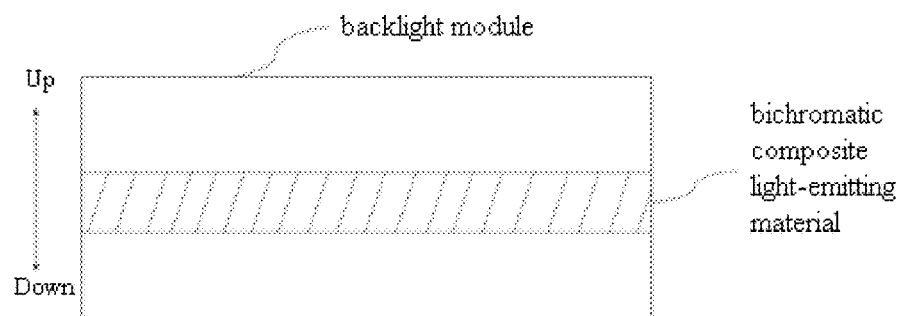
FIG. 9 is a structural schematic diagram of a backlight module of an LCD display device implemented according to the present application.

The semiconductor device in the present application may be a flexible device and had a structural schematic diagram as shown in FIG. 7. The composite light-emitting material described above may be a thin film and was directly used for flexible transparent substrates in electroluminescent devices. This flexible device may further have a light-emitting layer composed of an electroluminescent material. The photoluminescence property and the electroluminescent light emission of the γ-CsPbI$_3$ quantum dot particle were combined, so that the light-emitting properties of this flexible device may be further improved. As can be understood by those skilled in the art, the flexible device described above may further comprise a structure for achieving the properties of the device, such as a cathode, a metal anode, an electron transport layer, a hole transport layer, and the like as shown in FIG. 9, and verbose words are omitted herein.

Example 19

Figure 8:
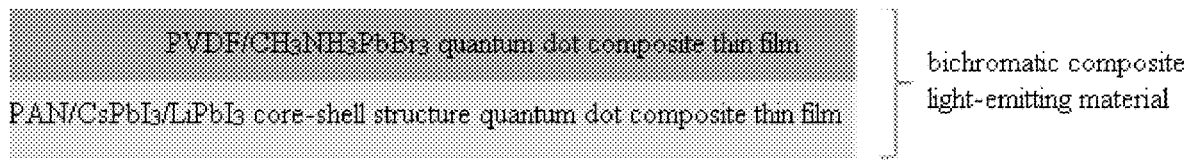
FIG. 8 is a structural schematic diagram of a bichromatic light-emitting composite thin film implemented according to the present application.

Based on the γ-CsPbI$_3$/LiPbI$_3$ core-shell structure quantum dot/PAN composite thin film produced in Example 5, a high-gamut white LED light-emitting material was produced and specific steps were as follows.
(1) Production of CH$_3$NH$_3$PbBr$_3$ quantum dot/PVDF green light-emitting composite thin film material In a first solution, the mass ratio of polymer:organic solvent=1:5, the polymer was polyvinylidene fluoride (PVDF), and the organic solvent was N,N-dimethylformamide (DMF). Mechanical stirring was performed for 12 h to obtain a clear and transparent solution. In a second solution, the molar ratio of PbBr$_2$ to CH$_3$NH$_3$Br was 1:1, the mass ratio of organic solvent:PbBr$_2$ was 1:0.01, and the organic solvent was N,N-dimethylformamide (DMF). Mechanical stirring was performed for 12 h to obtain a clear and transparent solution. The mass ratio of the first solution to the second solution was controlled to be 1:0.2, and mechanical stirring was performed for 24 h to obtain a uniformly mixed precursor solution.
(2) The precursor solution in step (1) described above was transferred to a transparent PET thin film by a spin coating method, and the thickness of the precursor solution on the transparent PET thin film was controlled to be 0.5 mm. The transparent PET thin film to which the precursor solution was attached was then placed in a vacuum drying oven, the vacuum drying oven had a pressure of 0.1 MPa and a temperature of 30° C., and drying was performed for 48 h to obtain a CH$_3$NH$_3$PbBr$_3$ quantum dot/PVDF green light-emitting composite thin film.
(3) The CH$_3$NH$_3$PbBr$_3$ quantum dot/PVDF green light-emitting composite thin film produced was combined with the γ-CsPbI$_3$/LiPbI$_3$ core-shell structure quantum dot/PAN composite thin film produced in Example 5 and applied to a white LED device structure to obtain a high-gamut white LED device. FIG. 8 is a structural schematic diagram of the bichromatic light-emitting thin film.

The CH$_3$NH$_3$PbBr$_3$ quantum dot/PVDF green light emit composite thin film material used in this Example was synthetically obtained according to the method disclosed in the invention patent publication No. WO2016180364A1, entitled "perovskite/polymer composite luminescent material, preparation method and application", or may be provided by Beijing Institute of Technology.

Example 20

Based on the γ-CsPbI$_3$/LiPbI$_3$ core-shell structure quantum dot/PAN composite thin film produced in Example 5, a high-gamut white LED light-emitting material was produced and specific steps were as follows.

An organic adhesive is applied to a side of the produced γ-CsPbI$_3$/LiPbI$_3$ core-shell structure quantum dot/PAN composite thin film, which was bonded to a side of the CH$_3$NH$_3$PbBr$_3$ quantum dot/PVDF composite thin film produced in step (2) in Example 19. Drying was performed at 50° C. for 1 h to allow for the curing of the adhesive to obtain a red-and-green bichromatic light-emitting composite.

Example 21

The steps were the same as those of Example 19 except for the followings. A side of a PET matrix of the CH$_3$NH$_3$PbBr$_3$ quantum dot/PVDF composite thin film was bonded to an adhesive, and a red-and-green bichromatic light-emitting composite was obtained after drying.

Example 22

Based on a composite, which was the γ-CsPbI$_3$/LiPbI$_3$ core-shell structure quantum dot/PAN composite thin film produced in Example 5, a high-gamut white LED light-emitting material was produced and specific steps were as follows.

The precursor solution produced in step (1) of Example 19 was coated on a side of the produced γ-CsPbI$_3$/LiPbI$_3$ core-shell structure quantum dot/PAN composite thin film quantum dot film by a spin coating method, and a CsPbI$_3$ quantum dot/PMMA composite thin film to which the precursor solution of the CH$_3$NH$_3$PbBr$_3$ quantum dot/PVDF composite thin film was then placed in a vacuum drying oven. The vacuum drying oven had a pressure of 0.1 MPa and a temperature of 30° C., and drying was performed for 48 h to obtain a red-and-green bichromatic light-emitting composite.

Example 23

The steps were the same as those of Example 22 except for the followings. A polycarbonate (PC) organic solution was coated on a side of a $\gamma$-$CsPbI_3$/$LiPbI_3$ core-shell structure quantum dot/PAN composite quantum dot film, the organic solvent of the solution was N,N-dimethylformamide (DMF), and the mass ratio of the organic solvent to polycarbonate (PC) was 1:0.8. The $\gamma$-$CsPbI_3$/$LiPbI_3$ core-shell structure quantum dot/PAN composite quantum dot film coated with the polycarbonate (PC) organic solution was placed in a vacuum drying oven. The vacuum drying oven had a pressure of 0.1 MPa and a temperature of 30° C., and drying was performed for 48 h to obtain a $CsPbI_3$ quantum dot/PMMA composite quantum dot film separated by a polycarbonate (PC) thin film. The precursor solution produced in step (1) of Example 19 was coated on a side of a polycarbonate (PC) separation film of the produced $\gamma$-$CsPbI_3$/$LiPbI_3$ core-shell structure quantum dot/PAN composite quantum dot film by a spin coating method, and a $CsPbI_3$ quantum dot/PMMA composite thin film to which the precursor solution of the $CH_3NH_3PbBr_3$ quantum dot/PVDF composite thin film was then placed in a vacuum drying oven. The vacuum drying oven had a pressure of 0.1 MPa and a temperature of 30° C., and drying was performed for 48 h to obtain a red-and-green bichromatic light-emitting composite.

Example 24

Figure 10:
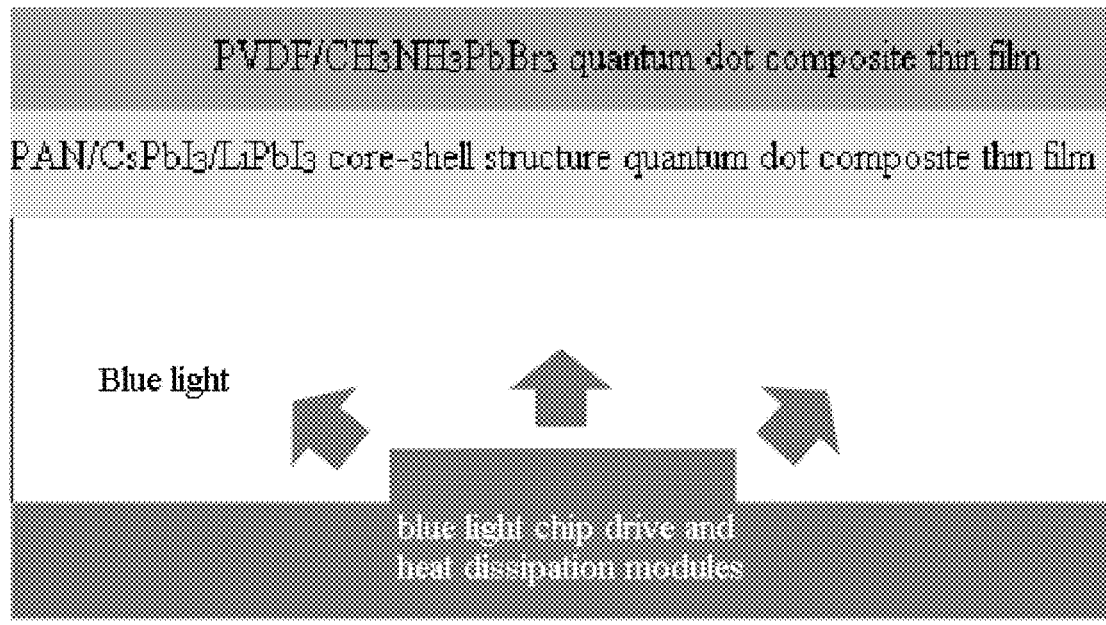
FIG. 10 is a structural schematic diagram of a photoluminescent device implemented according to the present application.

The composite light-emitting material described above may also be used for LCD display devices. Particularly, FIGS. 9 and 10 were referred to. First, a $\gamma$-$CsPbI_3$ quantum dot/polymer composite red light thin film was combined with a perovskite quantum dot/polymer composite green light thin film to produce a bichromatic (red light and green light) light-emitting thin film. This bichromatic light-emitting thin film was inserted between a plurality of film structures of an LCD backlight module, or the composite light-emitting material described above may also be directly coated onto an upper surface or a lower surface of a light guide plate, a diffusion film, or a prism film in an LCD backlight module, thereby achieving a high-gamut LCD backlight module using a blue LED as a light source.

Example 25

Based on the $\gamma$-$CsPbI_3$/$LiPbI_3$ core-shell structure quantum dot/PAN composite quantum dot film produced in Example 5, a high-gamut back light source for a liquid crystal display (LCD) was produced and specific steps were as follows by taking a 42-inch LCD as an example.
(1) Production of 42-Inch $CsPbI_3$ Quantum Dot/PMMA Composite Light-Emitting Thin Film A desired mass of a precursor solution was formulated according to the experimental protocol of Example 5. The precursor solution was uniformly transferred to a glass substrate having a corresponding size by a film wiper, and the thickness of the precursor solution was controlled to be 0.2 mm. The glass plate containing the precursor solution was then placed in a vacuum drying oven, dried at 0.05 MPa and 150° C. for 6 h, and withdrawn for use. The produced $CsPbI_3$ quantum dot/PMMA composite light-emitting thin film was then transferred to a light guide plate, a diffusion film, or a prism film in an LCD backlight module by a film transfer technique. In order to reduce processes, the precursor solution described above may also be directly transferred to a light guide plate, a diffusion film, or a prism film of an LCD backlight module by a film wiper, and drying was then performed under the same conditions to form an integrated light-emitting layer.
(2) Production of 42-Inch $CsPbI_3$ Quantum Dot/PMMA Light-Emitting Layer A precursor solution was formulated according to the experimental protocol of Example 5, and a film wiper was used to uniformly transfer the precursor solution to a substrate, which herein included a glass plate, or to a light guide plate, a diffusion film, or a prism film of an LCD backlight module. The precursor solution was controlled to have a thickness of 0.1 mm, placed in a vacuum drying oven, dried at 0.05 MPa and 150° C. for 6 h, and withdrawn to obtain a $CsPbI_3$ quantum dot/PMMA red light-emitting composite thin film having a high light emission efficiency.
(3) Assembly of LCD Backlight Module The light-emitting film obtained in steps (1) and (2) was inserted to an LCD backlight module, and the light source of the LCD backlight module may be replaced by a blue light source. The blue light source passed through a light guide plate and then passed through a red color light-emitting layers and a green color light-emitting layers, and white light was finally formed by combining three primary colors, which were red, green, and blue.

Example 26

A piezoelectric device was produced in this Example based on a perovskite/polymer composite light-emitting material, and specific steps were as follows.
(1) A precursor solution was formulated according to the experimental protocol of Example 8, and the precursor solution was then uniformly coated onto a substrate, which herein included an ITO conductive glass or a PET or PC flexible polymer substrate having a surface plated with gold/silver. The precursor solution was controlled to have a thickness of 0.5 mm, placed in a vacuum drying oven, dried at 0.05 MPa and 150° C. for 6 h, and withdrawn to obtain a $\gamma$-$CsPbI_3$/$Rb_4PbCl_6$ core-shell structure quantum dot/PMMA red light-emitting composite thin film having a high light emission efficiency.
(2) A gold electrode or a silver electrode was plated on a surface of the produced $\gamma$-$CsPbI_3$/$Rb_4PbCl_6$ core-shell structure quantum dot/PMMA red light-emitting composite thin film, a protective layer was then coated above the electrode to obtain a simple prototype of a piezoelectric device, and both electrodes of the piezoelectric device based on the composite thin film were connected to an oscilloscope through leads.
(3) A periodic action force was applied to the produced piezoelectric device based on the composite thin film, and a periodic pulse piezoelectric signal could be seen on the oscilloscope.

Example 27

Based on the $\gamma$-$CsPbI_3$/$LiPbI_3$ core-shell structure quantum dot/PAN composite thin film produced in Example 5, a solar concentrator was produced and specific steps were as follows by taking a 400-square-centimeter as an example.

(1) Production of 400-Square-Centimeter γ-CsPbI$_3$/LiPbI$_3$ Core-Shell Structure Quantum Dot/PAN Composite Thin Film A desired mass of a precursor solution was formulated according to the experimental protocol of Example 5, and a film wiper was used to uniformly transfer the precursor solution to a glass substrate having a corresponding size, wherein the thickness of the glass substrate was 2 mm and the length and the width were both 20 cm. The thickness of the precursor solution was controlled to be 0.2 mm. The glass plate containing the precursor solution was then placed in a vacuum drying oven, dried at 0.05 MPa and 150° C. for 6 h, and withdrawn for use.

(2) Production of Concentrator

The glass plate coated with the γ-CsPbI$_3$/LiPbI$_3$ core-shell structure quantum dot/PAN composite thin film in step (1) was placed in a plating machine, and three side surfaces of the glass plate were plated with aluminum, wherein the aluminum film plated had a thickness of 2 μm. The glass plate with aluminum plated was withdrawn, and a strip polysilicon solar panel was assembled onto the side surface of the glass plate on which aluminum was not plated. The circuit of the solar panel was connected to produce a solar concentrator.

The above contents are only several Examples of the present application and do not limit the present application in the form. Although preferred Examples are used to disclose the present application as above, they are not intended to limit the present application. Without departing from the scope of the technical solution of the present application, some variations and modifications made by any person skilled in the art using the technique contents disclosed above are all equivalent to equivalent Examples and are all within the scope of the technical solution.

What is claimed is:

1. A composite light-emitting material, wherein the composite light-emitting material comprises a perovskite nanomaterial and a matrix;
    the perovskite nanomaterial comprises y-CsPbI3 and an addition element M; and
    the addition element M is selected from at least one of Li, Na, K, and Rb,
    wherein the perovskite nanomaterial is a core-shell structure;
    a core is y-CsPbI$_3$; and
    a surface comprises the addition element M.

2. The composite light-emitting material according to claim 1, wherein;
    the surface comprises at least one of MPbX3 and M4PbX6, and X is selected from at least one of halogens.

3. The composite light-emitting material according to claim 1;
    wherein the surface is RbPbI3.

4. The composite light-emitting material according to claim 1, wherein the composite light-emitting material has a light emission peak at 600-680 nm.

5. The composite light-emitting material according to claim 1, wherein a molar ratio of y-CsPbI2 to the addition element M in the perovskite nanomaterial is 1:0.01-10.

6. The composite light-emitting material according to claim 1, wherein a molar ratio of y-CsPbI3 to the addition element M in the perovskite nanomaterial is 1:0.5-2.

7. The composite light-emitting material according to claim 1, wherein the matrix is a polymer, wherein the polymer is selected from at least one of polyvinylidene fluoride, a copolymer of polyvinylidene fluoride and trifluoroethylene, polyvinyl acetate, cellulose acetate, cyanocellulose, polysulfone, aromatic polyamide, polyimide, polycarbonate, polystyrene, and polymethyl methacrylate.

8. The composite light-emitting material according to claim 1, wherein a mass ratio of the perovskite nanomaterial to the matrix is 1:1-100.

9. The composite light-emitting material according to claim 1, wherein the composite light-emitting material further comprises an additive dispersed in the matrix; and
    the additive is selected from at least one of zinc bromide, zinc iodide, stannous bromide, stannous iodide, cadmium bromide, and cadmium iodide.

10. The composite light-emitting material according to claim 9, wherein a mass ratio of the matrix to the additive is 1:0.001-0.5.

11. The composite light-emitting material according to claim 1, wherein the perovskite nanomaterial further comprises a surface ligand formed on a surface of y-CsPbI3; and
    the surface ligand contains at least one of an organic acid, a halogenated organic acid, a C4-C24 organic amine, and a halogenated C4-C24 organic amine.

12. The composite light-emitting material according to claim 1, wherein a mass ratio of y-CsPbI3 to a surface ligand is 1:0.001-1.

13. A production method for the composite light-emitting material according to claim 1, characterized by comprising steps of:
    (1) obtaining a precursor solution containing a matrix, a perovskite precursor, and an addition element M; and
    (2) molding the precursor solution to obtain a modified perovskite nanomaterial.

14. The production method for the composite light-emitting material according to claim 13, wherein the addition element M is derived from a compound containing the addition element M; and
    the compound containing the addition element M is selected from at least one of LiCl, NaCl, KCl, RbCl, LiBr, NaBr, KBr, RbBr, LiI, NaI, KI, RbI, Li2CO3, Na2CO3, K2CO3, Rb2CO3, a Li metal-organic matter, a Na metal-organic matter, a K metal-organic matter, and a Rb metal-organic matter.

15. The production method for the composite light-emitting material according to claim 13, wherein step (1) comprises:
    (s11) obtaining a solution A containing the matrix;
    (s12) obtaining a solution B containing CsI, PbI2, and the addition element M;
    (s13) mixing the solution A and the solution B to obtain the precursor solution.

16. The production method for the composite light-emitting material according to claim 15, wherein the solution A further comprises an additive, and the additive is selected from at least one of zinc bromide, zinc iodide, stannous bromide, stannous iodide, cadmium bromide, and cadmium iodide.

17. The production method for the composite light-emitting material according to claim 15, wherein
    the solution B further comprises a surface ligand;
    the surface ligand contains at least one of an organic acid, a halogenated organic acid, a C4-C24 organic amine, and a halogenated C4-C24 organic amine; and
    the surface ligand is added in step (s12).

* * * * *